US006827826B2

(12) United States Patent
Demaray et al.

(10) Patent No.: US 6,827,826 B2
(45) Date of Patent: Dec. 7, 2004

(54) PLANAR OPTICAL DEVICES AND METHODS FOR THEIR MANUFACTURE

(75) Inventors: Richard E. Demaray, Portola Valley, CA (US); Kai-An Wang, Cupertino, CA (US); Ravi B. Mullapudi, San Jose, CA (US); Douglas P. Stadtler, Morgan Hill, CA (US); Hongmei Zhang, San Jose, CA (US); Rajiv Pethe, San Jose, CA (US)

(73) Assignee: Symmorphix, Inc., Sunnyvale, CA (US)

( * ) Notice: Subject to any disclaimer, the term of this patent is extended or adjusted under 35 U.S.C. 154(b) by 0 days.

(21) Appl. No.: 10/288,278

(22) Filed: Nov. 4, 2002

(65) Prior Publication Data

US 2003/0127319 A1 Jul. 10, 2003

Related U.S. Application Data

(60) Division of application No. 09/903,050, filed on Jul. 10, 2001, now Pat. No. 6,506,289, which is a continuation-in-part of application No. 09/633,307, filed on Aug. 7, 2000, now abandoned.

(51) Int. Cl.⁷ .......................... C23C 14/34; C23C 4/04; B31B 1/60

(52) U.S. Cl. ............................ 204/192.15; 204/192.12; 427/452; 427/453; 156/60

(58) Field of Search ....................... 204/298.12, 192.12, 204/192.15; 427/452, 453; 156/60; 228/101

(56) References Cited

U.S. PATENT DOCUMENTS

| 4,437,966 A | 3/1984 | Hope et al. ................. 204/298 |
| 4,915,810 A | * 4/1990 | Kestigian et al. ....... 204/298.04 |
| 5,107,538 A | 4/1992 | Benton et al. ............... 385/130 |
| 5,119,460 A | 6/1992 | Bruce et al. ................. 385/142 |
| 5,206,925 A | 4/1993 | Nakazawa et al. .......... 385/142 |
| 5,252,194 A | 10/1993 | Demaray et al. ........... 204/298 |
| 5,303,319 A | 4/1994 | Ford et al. ................... 385/131 |
| 5,306,569 A | 4/1994 | Hiraki ......................... 428/569 |
| 5,381,262 A | 1/1995 | Arima et al. ................. 359/341 |
| 5,475,528 A | 12/1995 | LaBorde ...................... 359/341 |
| 5,483,613 A | 1/1996 | Bruce et al. ................. 385/129 |
| 5,555,127 A | 9/1996 | Abdelkader et al. ........ 359/341 |
| 5,563,979 A | 10/1996 | Bruce et al. ................. 385/142 |
| 5,565,071 A | 10/1996 | Demaray et al. ............ 204/192 |
| 5,603,816 A | 2/1997 | Demaray et al. ............ 204/298 |
| 5,613,995 A | 3/1997 | Bhandarkar et al. .......... 65/384 |
| 5,719,976 A | 2/1998 | Henry et al. ................... 385/50 |
| 5,762,768 A | 6/1998 | Goy et al. ............. 204/298.13 |
| 5,831,262 A | 11/1998 | Greywall et al. ........... 250/227 |
| 5,841,931 A | 11/1998 | Foresi et al. ................. 385/131 |
| 5,847,865 A | 12/1998 | Gopinath et al. ........... 359/343 |
| 5,855,744 A | 1/1999 | Halsey et al. ................ 204/192 |
| 5,900,057 A | 5/1999 | Buchal et al. ............... 117/109 |
| 5,966,491 A | 10/1999 | DiGiovanni ................. 385/127 |
| 6,071,323 A | 6/2000 | Kawaguchi .................. 75/246 |
| 6,157,765 A | 12/2000 | Bruce et al. ................. 385/129 |
| 6,176,986 B1 | 1/2001 | Watanabe et al. ....... 204/298.13 |
| 6,210,544 B1 | 4/2001 | Sasaki ..................... 204/192.2 |
| 6,248,291 B1 | 6/2001 | Nakagama et al. ........... 419/46 |
| 6,302,939 B1 | 10/2001 | Rabin et al. ................... 75/338 |
| 6,409,965 B1 | 6/2002 | Nagata et al. ................ 419/26 |
| 6,416,598 B1 | 7/2002 | Sircar ......................... 148/688 |
| 2001/0027159 A1 | 10/2001 | Kaneyoshi ................... 501/152 |
| 2002/0106297 A1 | 8/2002 | Ueno et al. ................... 419/12 |
| 2002/0170821 A1 | 11/2002 | Sandlin et al. ......... 204/298.13 |
| 2003/0019326 A1 | 1/2003 | Han et al. ..................... 75/245 |
| 2003/0175142 A1 | 9/2003 | Milonopoulou et al. ...... 419/49 |

FOREIGN PATENT DOCUMENTS

| EP | 0 510 883 | 10/1992 | ............ H01S/3/23 |
| EP | 0 820 088 | 1/1998 | ............ H01J/37/34 |
| EP | 0867 985 | 9/1998 | ............ H01S/3/06 |
| JP | 6-10127 | 1/1994 | ............ C23C/14/35 |
| WO | WO 96/23085 | * 8/1996 | ............ C23C/14/34 |
| WO | WO 97/35044 | 9/1997 | ............ C23C/14/40 |
| WO | WO 00/21898 | 4/2000 | ............ C03C/13/04 |
| WO | WO 00/22742 | 4/2000 | ............ G02B/6/26 |

OTHER PUBLICATIONS

English translation of JP 6–10127.* Patent Abstracts of Japan, vol. 018, No. 215 (C–1191), Apr. 18, 1994, & JP 06 010127 A (ULVAC Japan Ltd), Jan. 18, 1994, abstract (1 page).

Asghari et al., "ASOC—A Manufacturing Integrated Optics Technology," Part of the SPIE Conference on Integrated Optics Devices III, SPIE vol. 3620, pp. 252–262 (Jan. 1999).

Bestwick, T., "ASOC silicon integrated optics technology," Part of the SPIE Conferences on Photonics Packaging and Integration, SPIE vol. 3631, pp. 182–190 (Jan. 1999).

Choi et al., "Er–Al–codoped silicate planar light waveguide– type amplifier fabricated by radio–frequency sputtering," Optics Letters, vol. 25, No. 4, pp. 263–265 (Feb. 15, 2000).

(List continued on next page.)

*Primary Examiner*—Steven VerSteeg
(74) *Attorney, Agent, or Firm*—Finnegan, Henderson, Farabow, Garrett & Dunner, LLP

(57) ABSTRACT

Physical vapor deposition processes provide optical materials with controlled and uniform refractive index that meet the requirements for active and passive planar optical devices. All processes use radio frequency (RF) sputtering with a wide area target, larger in area than the substrate on which material is deposited, and uniform plasma conditions which provide uniform target erosion. In addition, a second RF frequency can be applied to the sputtering target and RF power can be applied to the substrate producing substrate bias. Multiple approaches for controlling refractive index are provided. The present RF sputtering methods for material deposition and refractive index control are combined with processes commonly used in semiconductor fabrication to produce planar optical devices such surface ridge devices, buried ridge devices and buried trench devices. A method for forming composite wide area targets from multiple tiles is also provided.

5 Claims, 5 Drawing Sheets

OTHER PUBLICATIONS

Horst et al., "Compact, Tunable Optical Devices in Silicon–Oxynitride Wave Guide Technology," IBM Research Division, 3 pages (1999).

Hubner, J. and Guldberg–Kjaer, S., "Planar Er– and Yb–Doped Amplifiers and Lasers," COM Technical University of Denmark, 10th European Conf. On Integrated Optics, Session WeB2, pp. 71–74 (2001).

Kato et al., "Recent progress on PLC hybrid integration" Part of the SPIE Conference on Optoelectric Integrated Circuits III, SPIE. vol. 3631, pp. 28–36 (Jan. 1999).

Ladouceur, F. et al., "Effect of side wall roughness in buried channel waveguides," IEEE Proc., vol. 141, pp. 242–248 (Aug. 1994).

Laurent–Lund, C. et al., "PECVD Grown Multiple Core Planar Waveguides with Extremely Low Interface Reflections and Losses," IEEE Photonics Technology Letters vol. 10, No. 10, pp. 1431–1433 (Oct. 1998).

Lee, Kevin K. et al., "Effect of size and roughness on light transmission in a Si/SiO2 waveguide: Experiments and model," American Institute of Physics, pp. 1617–1619 (2000).

Marques, P.V.S. et al., "Planar Silica–on–Silicon Waveguide Lasers Based in Two Layer Core Devices," 10th European Conference on Integrated Optics, Session WeB2, pp. 79–82 (2001).

Ohkubo et al., "Polarization–Insensitive Arrayed–Waveguide Grating Using Pure Si)2 Cladding," Fifth Optoelectronics and Communication Conference (OECC 2000) Technical Digest, 2 pages (Jul. 2000).

Ono et al., "Design of a Low–Loss Y–branch Optical Waveguide," Fifth Optoelectronics and Communications Conference (OECC 2000) Technical Digest, 2 pages (Jul. 2000).

Roberts et al., "The Photoluminescence of Erbium–doped Silicon Monoxide," Department of Electronics and Computer Science, 7 pages (Jun. 1996).

Schermer, R. et al., "Investigation of Mesa Dielectric Waveguides,", Proceedings of the OSA Integrated Photonics Research Topical Meeting and Exhibit, Paper No. IWB3 (Jun. 11, 2001).

Shmulovich et al., "Recent progress in Erbium–doped waveguide amplifiers," Bell Laboratories, 3 pages (1999).

Tervonen, A., "Challenges and opportunities for integrated optics in optical networks," Part of the SPIE Conference in Integrated Optics Devices III, SPIE vol. 3620, pp. 2–11 (Jan. 1999).

Ting et al., "Study of planarized sputter–deposited SiO2," J. Vac. Sci. Technol., 15(3) pp. 1105–1112 (May/Jun. 1978).

M.P. Hehlen, et al., "Uniform upconversion in high–concentration $ER^{3+}$–doped soda lime silicate and aluminosilicate glasses," Optics Letters, vol. 22, No. 11 (Jun. 1, 1997).

K. Yoshikawa et al., "Spray formed aluminium alloys for sputtering targets," Power Metallurgy, vol. 43, No. 3 (2000).

* cited by examiner

PLANAR OPTICAL DEVICES AND METHODS FOR THEIR MANUFACTURE

RELATED APPLICATIONS

This application is a divisional of U.S. patent application Ser. No. 09/903,050, filed Jul. 10, 2001, entitled "Planar Optical Devices And Methods for Their Manufacture," issued as U.S. Pat. No. 6,506,289 on Jan. 14, 2003, which is a continuation-in-part of U.S. application Ser. No. 09/633,307, filed Aug. 7, 2000, which is incorporated herein by reference. This application is also related to the co-filed, commonly assigned U.S. application Ser. No. 09/903,081, which is incorporated herein by reference.

FIELD OF THE INVENTION

This invention relates generally to planar optical devices and materials and methods used in their manufacture, and, in particular, to optical components such as waveguides and amplifiers, and physical vapor deposition methods for their manufacture.

BACKGROUND

The increasing prevalence of fiber optic communications systems has created an unprecedented demand for devices for processing optical signals. Planar devices such as optical waveguides, couplers, splitters, and amplifiers, fabricated on planar substrates, like those commonly used for integrated circuits, and configured to receive and process signals from optical fibers are highly desirable. Such devices hold promise for integrated optical and electronic signal processing on a single semiconductor-like substrate.

The basic design of planar optical waveguides and amplifiers is well known, as described, for example in U.S. Pat. Nos. 5,119,460 to Bruce et al. 5,613,995 to Bhandarkar et al., (hereafter '995), 5,900,057 to Buchal et al., and 5,107,538 to Benton et al, to cite only a few. The devices consist, very generally, of a core region, typically bar shaped, of a certain refractive index surrounded by a cladding region of a lower refractive index. In the case of an optical amplifier, the core region contains a certain concentration of a dopant, typically a rare earth ion such as an erbium or praseodymium ion which, when pumped by a laser, fluoresces, for example, in the 1550 nm and 1300 nm wavelength range, respectively, used for optical communication, amplifying the optical signal passing through the core.

The performance of these planar optical devices depends sensitively on the value and uniformity of the refractive index of the core region and of the cladding region, and particularly on the difference in refractive index, $\Delta n$, between the regions. Particularly for passive devices such as waveguides, couplers, and splitters, $\Delta n$ needs to be sensitively controlled at values less than 1% and the refractive index of both core and cladding need to be highly uniform, for some applications at the fewer than parts per thousand level. In the case of doped materials forming the core region of planar optical amplifiers, it is important that the dopant be uniformly distributed so as to avoid non-radiative quenching or radiative quenching, for example by upconversion. The refractive index and other desirable properties of the core and cladding regions, such as physical and chemical uniformity, low stress, and high density, depend, of course, on the choice of materials for the devices and on the processes by which they are fabricated.

Because of their optical properties, silica and refractory oxides such as $Al_2O_3$, are good candidate materials for planar optical devices. Further, these oxides serve as suitable hosts for rare earth dopants used in optical amplifiers. A common material choice is so-called low temperature glasses, doped with alkali metals, boron, or phosphorous have the advantage of requiring lower processing temperatures. In addition, dopants are used to modify refractive index. Methods such as flame hydrolysis, ion exchange for introducing alkali ions in glasses, sputtering, and various chemical vapor deposition processes (CVD) have been used to form films of doped glasses. However, dopants, such as phosphorous and boron are hygroscopic, and alkalis are undesirable for integration with electronic devices. Control of uniformity of doping in CVD processes can be difficult and CVD deposited films can have structural defects leading to scattering losses when used to guide light. In addition, doped low temperature glasses may require further processing after deposition. A method for eliminating bubbles in thin films of sodium-boro-silicate glass by high temperature sintering is described, for example, in the '995 patent to Bhandarkar et al.

In the case of pure $SiO_2$, the most uniform optical material presently known is by atmospheric pressure thermal oxide (APOX). The APOX process can provide a 13 $\mu$m thick silica film having a precise refractive index of 1.4584, at 1550 nm, with a $1\sigma$ variance in the refractive index across a 150 mm wafer of $3\times10^{-5}$. However, the APOX process does not provide a method of making films with different indices of refraction. It is, therefore, not suitable for forming a waveguide core film with a desired refractive index (n).

Thus, there remains a need for a process to provide optical materials with a specified and uniform index of refraction for planar optical devices. It would be desirable if the material additionally exhibits high optical transparency, low stress, and high density and is free of structural defects.

SUMMARY

A physical vapor deposition process provides optical materials with controlled and uniform refractive index that meet the requirements for active and passive planar optical devices. According to a first aspect of the present invention, radio frequency (RF) sputtering of a wide area target in the presence of a sputtering gas under a condition of uniform target erosion is used to deposit physically and chemically uniform material on a substrate. The substrate is positioned opposite a planar target of the material to be deposited, the area of the target being larger than the area of the substrate. A central area of the target of the same size as the substrate and overlying the substrate is exposed to a uniform plasma condition, which provides a condition of uniform target erosion. A uniform plasma condition can be created without magnetic enhancement, termed diode sputtering, or by providing a time-averaged uniform magnetic field by scanning a magnet across the target in a plane parallel to the plane of the target.

According to an aspect of the present invention, a film deposited on the substrate using a wide area target and uniform target erosion is of uniform thickness for targets with an area at least 1.5 times the area of the substrate. In addition, film deposited on a substrate positioned opposite a central region of the target inside the region providing film thickness uniformity exhibits physical and chemical uniformity useful for fabricating optical devices. The region providing chemical uniformity can be coextensive with the region providing thickness uniformity.

According to another aspect of the present invention, a dual frequency RF sputtering process is used in which the high frequency RF power applied to the target is augmented by applying low frequency RF power to the target, resulting in densification of the deposited film and better coverage of features when deposited over underlying layers. Further, the dual frequency RF process can be used to tune the refractive index of the deposited film. Keeping the total RF power the same, the refractive index tends to increase with the ratio of low frequency to high frequency RF power.

In yet another method, RF power is applied to the substrate resulting in substrate bias. Substrate bias is used with single frequency or with dual frequency RF sputtering to provide improved density and morphology of deposited films and to complete coverage and filling of features on underlying layers. Furthermore, substrate bias contributes to uniformity of refractive index. Films deposited by diode sputtering including application of substrate bias demonstrate exceptional refractive index uniformity and low average surface roughness.

According to another aspect of the present invention, the refractive index of the material deposited using an RF sputtering process can be deliberately tuned by modifying other plasma processing conditions. First, raising the deposition temperature increases the refractive index of the resulting material. Second, increasing the RF power applied to the target increases the refractive index of the deposited material. Third, a reactive process gas can be added to the sputtering chamber which effectively modifies the chemical composition of the deposited material with a corresponding change in refractive index. Additionally, the refractive index of deposited material can be modified by using a target material in a specific oxidation state. The RF sputtering method is applicable to depositing pure materials and mixed materials including materials containing rare earth dopants for optical amplifier applications. Thus, wide area RF sputtering can be used together with the present refractive index control methods to provide core and cladding materials with a desired difference in refractive index for planar optical waveguides and optical amplifiers.

The present RF sputtering methods for material deposition and refractive index control are combined with processes commonly used in semiconductor fabrication to produce planar optical devices. A surface ridge optical device is produced by using RF sputtering to deposit a stack comprising an upper cladding layer, a middle core layer, and a lower cladding layer on a substrate. A ridge is etched into the upper cladding layer and partway through the thickness of the core layer to produce the surface ridge device. A buried ridge device is produced by etching a ridge into a layer of core material overlying a cladding layer. A top layer of cladding material is deposited over the core ridge by RF sputtering with substrate bias. Use of substrate bias enables the cladding layer to completely cover the exposed ridge without defects. Further, the deposition methods described here are used to fabricate a buried trench device in which RF sputtering with substrate bias completely fills a trench in a layer of cladding material with core material.

Finally, a method for forming composite wide area targets from multiple tiles is provided. The method includes positioning the tiles on a backing plate in a noncontact array.

BRIEF DESCRIPTION OF THE DRAWINGS

FIG. 1b is an expanded view of a portion of the apparatus of FIG. 1a.

DETAILED DESCRIPTION

A physical vapor deposition process provides optical materials with controlled and uniform refractive index that meet the requirements for active and passive planar optical devices. The process uses radio frequency (RF) sputtering with a wide area target and a condition of uniform target erosion and includes multiple approaches for controlling refractive index.

Figure 1A:
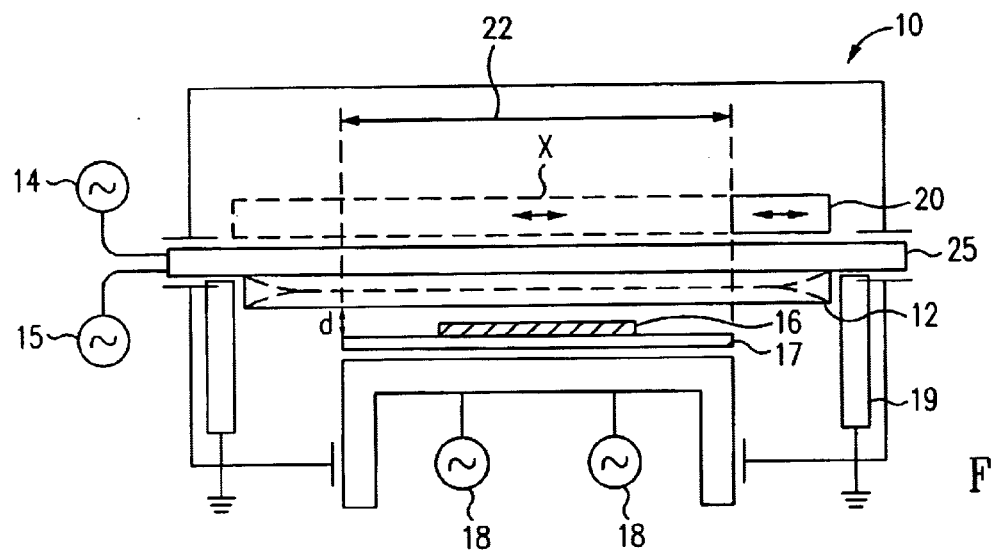
FIG. 1a is a schematic drawing of a physical vapor deposition apparatus in which wide area target RF sputtering, according to embodiments of the present invention, is performed.

An apparatus 10 for RF sputtering of controlled refractive index material for planar optical devices is illustrated schematically in FIG. 1a. The apparatus includes a wide area sputter source target 12 which provides material to be deposited on substrate 16. Substrate 16 is positioned parallel to and opposite target 12. Target 12 functions as a cathode when RF power is applied to it and is equivalently termed the cathode. Target 12 is a uniform source of material having a uniform index of refraction. Target 12 is typically composed of pure materials such as quartz, alumina, or sapphire, (the crystalline form of alumina), or mixtures of compounds of optically useful materials. Optically useful materials include oxides, fluorides, sulfides, nitrides, phosphates, sulfates, and carbonates, as well as other wide band gap semiconductor materials. To achieve uniform deposition, target 12, itself is chemically uniform, flat, and of uniform thickness over an extended area. In practice, target 12 is a composite target fabricated from individual tiles, precisely bonded together on a backing plate with minimal separation. A method of making chemically uniform tiles of mixed materials and attaching them to a backing plate 25, forming target 12, comprises another aspect of the present invention that is described in detail below. The complete target assembly also includes structures for cooling the target as described in U.S. Pat. No. 5,565,071 to Demaray et al, and incorporated herein by reference.

For fabricating planar optical devices, substrate 16 is a solid, smooth surface. Typically, substrate 16 is a silicon wafer or a silicon wafer coated with a layer of silicon oxide formed by a chemical vapor deposition process or by a thermal oxidation process. Alternatively, substrate 16 is a glass, such as Corning 1737 (Corning Inc., Elmira, N.Y.), a glass-like material, quartz, a metal a metal oxide, or a plastic material. Substrate 16 typically is supported on a holder or carrier sheet 17 that may be larger than substrate 16.

An essential feature of the present method is that the area of wide area target 12 is greater than the area on the carrier sheet on which physically and chemically uniform deposition is accomplished. Secondly, it is also essential that a central region on target 12, overlying the substrate 16, be provided with a very uniform condition of sputter erosion of the target material. Uniform target erosion is a consequence of a uniform plasma condition. In the following discussion, all mention of uniform condition of target erosion is taken to be equivalent to uniform plasma condition. Uniform target erosion is evidenced by the persistence of film uniformity throughout an extended target life. A uniform deposited film is defined as a film having a nonuniformity in thickness, when measured at representative points on the entire surface of a substrate wafer, of less than about 5%. Thickness nonuniformity is defined, by convention, as the difference between the minimum and maximum thickness divided by twice the average thickness. If films deposited from a target from which more than about 20% of the weight of the target has been removed continue to exhibit thickness uniformity, then the sputtering process is judged to be in a condition of uniform target erosion for all films deposited during the target life.

Thus, it is essential that a uniform plasma condition be created in the region between the target and the substrate overlying the substrate. The region of uniform plasma condition is indicated in the exploded view of FIG. 1b. A plasma is created in the region denoted 51, which extends under the entire target 12. The central region of the target 52, experiences the condition of uniform sputter erosion. As discussed further below, a layer deposited on a substrate placed anywhere below central region 52 will have uniform film thickness.

In addition, the region in which deposition provides uniform film thickness is larger than the area in which deposition provides a film with uniform physical or optical properties such as chemical composition or index of refraction. In the present invention it is essential that the target be planar or approximately planar for the formation of a film on a planar substrate which is to be coated with the material of the target. In practice, planarity of the target means that all portions of the target surface in region 52 are within a few millimeters of a planar surface, typically within 0.5 mm.

Multiple approaches to providing a uniform condition of sputter erosion of the target material can be used. A first approach is to sputter without magnetic enhancement. Such operation is referred to as diode sputtering. Using a large area target with a diode sputtering process, a dielectric material can be deposited so as to provide suitably uniform film thickness over a central portion of an adjacent substrate area. Within that area, an area of highly uniform film may be formed with suitable optical uniformity. The rate of formation of films of many microns of thickness by diode sputtering can be slow for small targets. However, in the present method, using large targets, a disadvantage in speed of diode sputtering can be compensated by batch processing in which multiple substrates are processed at once.

Other approaches to providing a uniform condition of sputter erosion rely on creating a large uniform magnetic field or a scanning magnetic field that produces a time-averaged, uniform magnetic field. For example, rotating magnets or electromagnets can be utilized to provide wide areas of substantially uniform target erosion. For magnetically enhanced sputter deposition, a scanning magnet magnetron source is used to provide a uniform, wide area condition of target erosion. Diode sputtering is known to provide uniform films; the magnetron sputtering process described here provides diode-sputtering-like uniformity in a magnetically enhanced sputtering process.

As illustrated in FIG. 1a, apparatus 10 also includes a scanning magnet magnetron source 20 positioned above target 12. A scanning magnetron source used for dc sputtering of metallic films is described in U.S. Pat. No. 5,855,744 to Halsey, et. al., (hereafter '744), which is incorporated herein by reference, and in references therein. The '744 patent demonstrates the improvement in thickness uniformity that is achieved by reducing local target erosion due to magnetic effects in the sputtering of a wide area rectangular target. By reducing the magnetic field intensity at these positions, the local target erosion was decreased and the resulting film thickness nonuniformity was improved from 8%, to 4%, over a rectangular substrate of 400×500 mm.

Figure 2:
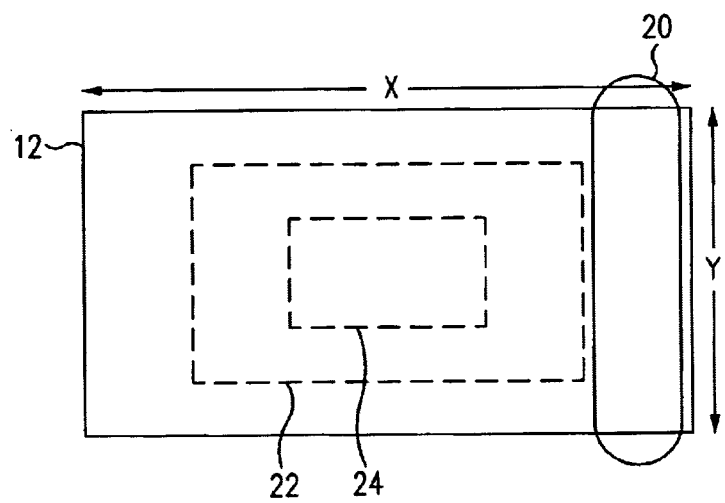
FIG. 2 is a top down view of the wide area target, scanning magnet, and carrier sheet of the apparatus of FIG. 1.

A top down view of magnet 20 and wide area target 12 is shown in FIG. 2. A film deposited on a substrate positioned on carrier sheet 17 directly opposed to the region of the target indicated by reference numeral 22 has good thickness uniformity. Area 22 is the same size as region 52 of the target, FIG. 1b, that is exposed to a uniform plasma condition. In some implementations, carrier 17 is coextensive with region 22. Reference 24 indicates the area below which both physically and chemically uniform deposition is achieved, where physical and chemical uniformity provide refractive index uniformity. FIG. 2 indicates that the region 22 of the target providing thickness uniformity is, in general, larger than the region 24 of the target providing thickness and chemical uniformity. In optimized processes, however, regions 22 and 24 may be coextensive.

Figure 1B:
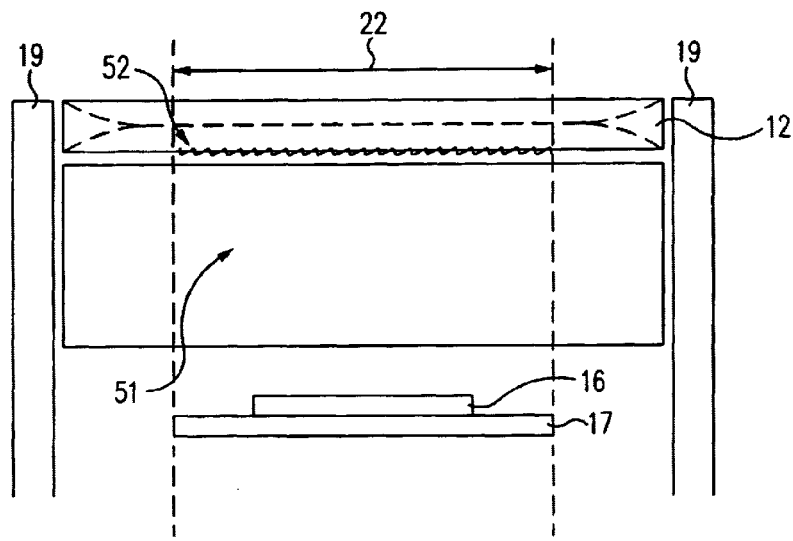

Magnet 20 extends beyond area 22 in one direction, the Y direction in FIG. 2, so that scanning is necessary in only one direction, the X direction, to provide a time averaged uniform magnetic field. As shown in FIGS. 1a and 1b, magnet 20 is scanned over the entire extent of target 12 which is larger than the region 52 of uniform sputter erosion. Magnet 20 is moved in a plane parallel to the plane of the target.

Using a wide area target and a scanning magnet to RF sputter a planar silica target 12 of dimension 550×650 mm, a film with thickness nonuniformity of ±5% has been obtained on a substrate placed opposite a region of the target of dimension 300×400 mm. The thickness nonuniformity of a 300 mm diameter circular substrate at the center of this region can be less than ±3%. Refractive index nonuniformity at the 150 mm center of the region of less than one part in a thousand has been obtained. The results reported here have been obtained, however, without extensive optimization. Those skilled in the art will recognize that by changing details of the scanning of the magnet, such as the tilt and dwell of the magnet, as described, for example, in '744, further optimization can be achieved. A useful general criterion for the present method of RF sputter deposition, therefore, is that the wide area target be at least 1.5 times the area of the region on the carrier sheet on which physically uniform deposition is obtained. Since the carrier sheet can accommodate a single large substrate or multiple smaller substrates, the criterion can be expressed as the requirement that the area of the target be at least 1.5 times the area of the substrate.

Alternative sputter source designs might be expected to provide a film on a 150 mm wafer with a thickness nonuniformity less than 5%. The results reported for sample C in Example 1 below, demonstrate 4.4% thickness nonuniformity, which corresponds to slightly more than 1.5% 1 sigma variance. As sample C shows, the nonuniformity of the index of refraction is 0.067%, or less than 1 part in a thousand. What is not obvious is that a film with more than 1.5% 1 sigma thickness variance should have a uniformity of index of refraction more than an order of magnitude better. According to one aspect of the present invention, the uniform index of refraction is due to the attributes of the wide area, uniform region of target erosion.

The present method using a wide area target with uniform sputter erosion offers significant advantages over previous deposition approaches. It is possible to form a film with uniform thickness using a target that is smaller in plane area than the substrate. One way to do so is to move the substrate with respect to the source or cathode in such a fashion that the film formed is uniform in thickness. However, such a film will not have been formed under uniform process conditions, such as plasma density, the rate and angle of arrival of the vapor at the substrate, etc. Thus such films will not be uniform in physical properties such as density, refractive index, or resistivity, resulting in nonuniform optical and electrical performance.

It is also well known that it is possible to form a film of uniform thickness from a nonuniform sputter source, say a sputter target with a stationary sputter groove having substantial and increasingly nonuniform erosion through the useful portion of the target life. Such an approach is described, for example, in U.S. Pat. No. 5,252,194 to Demaray et al. Similarly, such a nonuniform source of material will not form a film having uniform electrical or optical properties. The example of the ring or cone shaped sputter source illustrates one effect. The anisotropy of the angle of arrival alone can have a substantial effect on the density of the film that is formed. Since the transmission of optical dielectric material can double due to the removal of the last several hundredths of 1 percent of density, it is clear that the uniformity of the target erosion, though not essential to the uniformity of the film thickness can be essential to the formation of a film having uniform optical properties.

By means of the present invention, the conditions of sputtering at the target surface, such as the uniformity of erosion, the average temperature of the plasma at the target surface and the equilibration of the target surface with the gas phase ambient of the process are uniform over a region which is greater than or equal to the region to be coated with a uniform film thickness. In addition, the region of uniform film thickness is greater than or equal to the region of the film which is to have highly uniform optical properties such as index of refraction, density, transmission or absorptivity.

Returning to FIG. 1a, apparatus 10 includes RF generator 14 for applying RF power to target 12 to generate a plasma in a background gas. RF generator 14 is a high frequency source, conventionally operated at 13.56 MHz. Typical process conditions for RF sputter deposition include applying high frequency RF power in the range of about 500 to 5000 watts. An inert gas, typically, argon, is used as the background sputtering gas. The deposition chamber is operated at low pressure, between about 0.5 millitorr and 8–10 millitorr. Typical process pressure is below about 2 millitorr where there are very few collisions in the gas phase, resulting in a condition of uniform "free molecular" flow. This ensures that the gas phase concentration of a gaseous component is uniform throughout the process chamber.

For example, in the apparatus used in the Examples below, background gas flow rates in the range of about 30 to about 100 sccm, used with a pump operated at a fixed pumping speed of about 50 liters/second, result in free molecular flow conditions. The distance d, in FIG. 1a, between the target and the substrate is varied between about 4 cm and 9 cm. A typical source to substrate distance d is 6 cm. The source to substrate distance is chosen to optimize the thickness uniformity of the film. At large source to substrate distances the film thickness distribution is dome shaped with the thickest region of the film at the center of the substrate. At close source to substrate distance the film thickness is dish shaped with the thickest film formed at the edge of the substrate. The substrate temperature is held constant in the range of about 40° C. to about 550° C. and can be maintained at a chosen temperature to within about 10° C. by means of preheating the substrate and the substrate holder prior to deposition. During the course of deposition, the heat energy impressed upon the substrate by the process must be conducted away from the substrate by cooling the table on which the substrate is positioned during the process, as known to those skilled in the art. The process is performed under conditions of uniform gas introduction, uniform pumping speed, and uniform application of RF power to the periphery of the target as known to skilled practitioners.

The speed at which a scanning magnet 20 is swept over the entire target is determined such that a layer thickness less than about 5 to 10 Å, corresponding roughly to two to four monolayers of material, is deposited on each scan. The rate at which material is deposited depends on the applied RF power and on the distance d, in FIG. 1a, between the target 12 and the substrate 16. With the silica target described above, scanning speeds between about 2 sec/one-way scan across the target to 20–30 sec/scan provide a beneficial layer thickness. Limiting the amount of material deposited in each pass promotes chemical and physical uniformity. With the typical process conditions, the rate of deposition of pure silica is approximately 0.8 Å/kW-sec. At an applied RF power of 1 kW, the rate of deposition is 0.8 Å/sec. At a magnet scan speed that provides a scan of 2 seconds, a film of 1.8 Å nominal thickness is deposited.

A thickness of 2.4 Å can be associated with one monolayer of amorphous silica film. The impingement rate of process gas equivalent to a monolayer per second occurs at approximately $1 \times 10^{-6}$ torr. The process gas may contain oxygen atoms ejected from the silica during sputtering in addition to the background inert gas. For typical process conditions near 1 millitorr, $4 \times 10^3$ monolayers of process gas impinge on the film during the 4 second period of deposition. These conditions provide adequate means for the equilibration of the adsorbed sputtered material with the process gas, if the sputtered material has a uniform composition. Uniform, wide area target erosion is required so as to ensure that the adsorbed sputtered material has a uniform composition.

According to another aspect of the present invention, a dual frequency RF sputtering process, in which low frequency RF power is also applied to the target, is used. Returning to FIG. 1a, apparatus 10 includes RF generator 15, in addition to RF generator 14 described previously. RF generator 14 is a high frequency source, typically 13.56 MHz, while RF generator 15 provides power at a much lower frequency, typically from about 100 to 400 kHz. Typical process conditions for dual frequency RF deposition include high frequency RF power in the range of about 500 to 5000 watts and low frequency RF power in the range of about 500 to 2500 watts where, for any given deposition, the low frequency power is from about a tenth to about three quarters of the high frequency power. The high frequency RF power is chiefly responsible for sputtering the material of target 12. The high frequency accelerates electrons in the plasma but is not as efficient at accelerating the much slower heavy ions in the plasma. Adding the low frequency RF power causes ions in the plasma to bombard the film being deposited on the substrate, resulting in sputtering and densification of the film.

In addition, the dual frequency RF deposition process generally results in films with a reduced surface roughness as compared with single frequency deposition. For silica, films with average surface roughness in the range of between about 1.5 and 2.6 nm have been obtained with the dual frequency RF process. Experimental results for single and dual frequency deposition are further described in Example 4 below. As discussed in the co-filed, commonly assigned U.S. application No. 09/903,081, filed Jul. 10, 2001, which is incorporated herein by reference, reducing surface roughness of core and cladding materials is key to reducing scattering loss in planar optical devices.

Further, the dual frequency RF process can be used to tune the refractive index of the deposited film. Keeping the total RF power the same, the refractive index of the deposited film tends to increase with the ratio of low frequency to high frequency RF power. For example, a core layer of a planar waveguide can be deposited by a dual frequency RF process, and the same target 12, can be used to deposit a cladding layer using a single frequency RF process. Introducing low frequency RF power in the core layer deposition process can therefore be used to provide the difference in refractive index between core and cladding layer materials.

It is particularly beneficial to further augment the single frequency or dual frequency RF sputtering process by additionally applying RF power to the substrate 16, using, for example, substrate RF generator 18. Applying power to the substrate, resulting in substrate bias, also contributes to densification of the film. The RF power applied to the substrate can be either at the 13.56 MHz high frequency or at a frequency in the range of the low frequency RF. Substrate bias power similar to the high frequency RF power can be used.

Substrate bias has been used previously to planarize sputter deposited quartz films. A theoretical model of the mechanism by which substrate bias operates, has been put forward by Ting et al. (J. Vac. Sci. Technol. 15, 1105 (1978)). When power is applied to the substrate, a so-called plasma sheath is formed about the substrate and ions are coupled from the plasma. The sheath serves to accelerate ions from the plasma so that they bombard the film as it is deposited, sputtering the film, and forward scattering surface atoms, densifying the film and eliminating columnar structure The effects of adding substrate bias are akin to, but more dramatic than, the effects of adding the low frequency RF component to the sputter source.

Using the bias sputtering process, the film is simultaneously deposited and etched. The net accumulation of film at any point on a surface depends on the relative rates of deposition and etching, which depend respectively, on the power applied to the target and to the substrate, and to the angle that the surface makes with the horizontal. The rate of etching is greatest for intermediate angles, on the order of 45 degrees, that is between about 30 and 60 degrees.

The target and substrate powers can be adjusted such that the rates of deposition and etching are approximately the same for a range of intermediate angles. In this case, films deposited with bias sputtering have the following characteristics. At a step where a horizontal surface meets a vertical surface, the deposited film makes an intermediate angle with the horizontal. On a surface at an intermediate angle, there will be no net deposition since the deposition rate and etch rate are approximately equal. There is net deposition on a vertical surface.

A bias sputtering process without magnetic enhancement has been observed to provide deposited films with exceptionally low surface roughness and exceptional refractive index uniformity. As described in Example 5 below, using substrate bias in a diode sputtering process, a silica film with an average surface roughness of 0.14 nm and a refractive index uniformity of less than $4 \times 10^{-5}\%$ has been obtained. Further, as demonstrated in FIG. 7, diode bias sputtering produces structures with the characteristic intermediate angle of the external surface of the film portion covering a raised ridge. Diode bias sputtering therefore, offers particular advantages for forming the core layer of certain waveguide structures, as further discussed in the '522 application.

Dual frequency RF sputter deposition processes or single or dual frequency RF sputtering including substrate bias provide dense films with excellent physical structure for use in planar optical devices. The present processes overcome problems that have been observed in the past in some conventionally deposited, particularly CVD deposited films, which can display so-called "columnar", through thickness structure. In cross section, under magnification, the structure appears like a close packed group of columns or grains. Between the columns, there is often a diffusion path, referred to as "leader" defects. The columnar morphology contributes to the roughness of the surfaces and sidewalls of conventional films after etching during fabrication into devices. The through thickness defects as well as the surface roughness scatters guided light, resulting in insertion and transmission losses. Thus the transparency of materials produced by dual frequency and substrate bias deposition is advantageous for building low loss optical devices.

The use of substrate bias can also influence the refractive index of the deposited film. In the case of an argon gas process, it can be expected that substrate bias will result in densification and etching of the film. An argon bias process can be expected to rise the index of a film deposited from a pure $SiO_2$ target. However, the rate of etching is proportional to the local plasma density and that density is proportional to the local plasma density at the target cathode. Here again, the uniformity of the target plasma, as demonstrated by the uniformity of the nearby target erosion is very important for the uniformity of the effect of the substrate bias. Thus, use of substrate bias reinforces the benefits of the wide area target used under condition of uniform target erosion, of the present invention, to provide films with highly uniform optical properties.

According to another aspect of the present invention, the refractive index of the material deposited using an RF sputtering process can be deliberately tuned by modifying other plasma processing conditions, provided that such process conditions influence a substantially uniform region of a wide area cathode in a uniform way. First, it has been determined that raising the deposition temperature increases the refractive index of the resulting material. Second, increasing the RF power applied to the target increases the refractive index of the deposited material. Third, a reactive process gas can be added to the sputtering chamber which effectively modifies the chemical composition of the deposited material with a corresponding change in refractive index. In general, adding a reducing gas, such as hydrogen, increases the refractive index and adding an oxidizer, such as oxygen, decreases the refractive index. Nitrogen is also a useful process gas. The direction of the effect on refractive index of replacing some of the argon with nitrogen depends on the chemical composition of the target.

For example, as reported in detail in Example 1, for a pure silica, that is $SiO_2$, target, increasing the process temperature from 40° C. to 400° C. results in an over 0.7% increase in refractive index, from 1.438 to 1.449. The process temperature is the temperature at which the substrate carrier 17 is uniformly maintained. All refractive indices reported here are measured at 1550 nm. Increasing the process power from 800 W to 1200 W increases the refractive index of the deposited material by about 0.5%. Larger changes can be effected by using higher process power or by using reactive process gases in the sputtering chamber. Replacing a third of the argon with nitrogen at 150° C. provides an increase in refractive index of about 7%. Replacing argon as the sputtering gas with a mixture of 2% $H_2$ in Ar results in an increase in refractive index of over 2% at 150° C.

Another approach to providing material with a tailored refractive index is to employ a target material in a specific oxidation state. In the silicon/oxygen system, for example, the refractive index of a bulk $SiO_2$ target is typically around 1.44. Using the present refractive index control methods with an $SiO_2$ target, materials with refractive indices between 1.44 and 1.58 have been obtained. Alternatively, as demonstrated in Example 3, target 12 can be composed of silicon monoxide, SiO, which in the bulk state has a refractive index on the order of 1.8. RF sputtered SiO using argon as the sputtering gas has a refractive index slightly above 2, while SiO that was sputtered using a mixture of argon and nitrogen can have a refractive index lowered by over 15% to below 1.75, depending on the process conditions.

While not bound by any theory, the inventors explain the observed process gas effects on refractive index in the silicon/oxygen system in terms of free electron density on the silicon atoms in the material. Metallic silicon with a high electron density has a high refractive index, about 3.4. Combining silicon atoms with oxygen, which is highly electronegative, that is electron withdrawing, reduces the electron density on silicon, reducing the refractive index to 1.8, for SiO, and to 1.44 for $SiO_2$. During sputtering of SiO, some of the oxygen is removed by collision with argon ions in the plasma, resulting in sputtered material with a higher refractive index than the SiO target. Nitrogen atoms are electronegative, but not as strongly electronegative as oxygen. When nitrogen is used as a process gas in sputtering of SiO, some nitrogen is added to SiO to form SiON, in which the N adds to withdrawing electrons from Si, lowering the refractive index. However, when nitrogen is used in sputtering of $SiO_2$, some nitrogen replaces oxygen to form some SiON. In this case, the nitrogen is less electronegative than the oxygen and the refractive index goes up. With this understanding, the practitioner can use reactive process gases to tune refractive index at will.

For passive optical devices, differences in refractive index between the core and the cladding of between about 0.25% and 1.5% are typically required. Thus, wide area RF sputtering can be used together with choice of target oxidation state and refractive index control by varying temperature, power and/or reactive gas to produce both core and cladding materials with a desired Δn. The ability to reproducibly and uniformly provide materials with a range of refractive index enables designers to optimize optical components for geometric or other considerations and specify the desired refractive index of the materials rather than being limited to the values that result from conventional CVD deposition processes.

The specific examples discussed to this point have focused on deposition from targets composed of oxides of silicon. The wide area target RF sputtering process is likewise advantageous for deposition of rare earth doped materials used for the core region of planar optical amplifiers. To deposit rare earth doped materials, a target that is a mixture or compound of the rare earth, typically an oxide, fluoride, sulfide, or nitride, and a suitable oxide host is used. For example, to deposit Er doped SiO, powdered SiO and $Er_2O_3$ is thoroughly mixed, and formed into tiles by low temperature isostatic pressure. The present method can be applied to provide rare earth compounds doped in any of the combinations of oxides, including silica and alumina, or silica and alumina augmented by such other host material as yittria, zirconia, titania, or other materials that have been proposed for optical amplifier applications. A mixture of rare earth dopants can be provided, as desired.

Doping oxides of silicon with erbium raises the refractive index of the doped material with respect to the refractive index of the host material. For example, as reported here in sample C of Example 2, a film with an Er concentration of approximately $2\times10^{20}$ atoms/cm$^3$ in SiO, deposited by RF sputtering, has a refractive index that is 2.3% above that of RF sputtered SiO. The difference in refractive index between the doped core region and the cladding region has an important effect on the performance of planar optical amplifiers. For amplifiers, Δn values between about 0.25% and 15% are typically required. The index control methods described here are beneficially used to provide cladding region materials with a suitable Δn with respect to the doped core region. In the past, additional, so-called tertiary, species such as alkali, phosphorous, boron, and ceria have been introduced into optical layers for refractive index control, raising the index of the core or bringing the refractive index of the cladding up to a desired Δn from the refractive index of the doped core. Such tertiary species can diffuse into the core region and detrimentally interfere with rare earth ion luminescence. Moreover, such tertiary species can raise the coefficient of thermal expansion of the material causing stress and birefringence problems. The present method of wide area target RF sputtering with index control avoids the disadvantages of index modification by tertiary additives.

The chief requirement for applying the present method to deposit doped mixed oxide materials for use in optical amplifiers is that the wide area alloy target be completely uniform in chemical composition, at least to the level of the powder metallurgy utilized to form the powder mixture. Typical powder sizes are between tens and hundreds of microns. In the case of refractory oxide additions, it may be useful to pre-alloy these with the rare earth additions. Plasma spray, transient melting or induction melting may be utilized to form a powder which is a solution or alloy of such materials. In the case of mixed materials containing alumina, for example, the low sputter yield of pure alumina can lead to segregation of the target material during sputtering. This causes the film to be low in aluminum with respect to the alloy target composition. It also can lead to particle production from the cathode. The high solubility of the rare earth material in alumina and the high sputter efficiency of the rare earth doped alumina suggest that practical formation of a sputter target material proceed through a first step of alloying the rare earth dopant and one or more of the host oxide additions to form a first powder material. The remainder of the host materials can be added prior to consolidation of the alloy target material. With this understanding the practitioner can fabricate alloy tiles of uniform composition.

According to yet another aspect of the present invention, a method of forming targets 12 composed of individual tiles is provided. In order to form a wide area target of an alloy target material, the consolidated material must first be uniform to the grain size of the powder from which it is formed. It also must be formed into a structural material capable of forming and finishing to a tile shape having a surface roughness on the order of the powder size from which it is consolidated. As an example, the manufacture of indium tin oxide targets for wide area deposition has shown that it is impractical to attempt to form a single piece, wide area target of fragile or brittle oxide material. The wide area sputter cathode is therefore formed from a close packed array of smaller tiles. A target of a size used in the Examples herein may have from 2 to 20 individual tiles. The tiles are finished to a size so as to provide a margin of non-contact, tile to tile, 29 in FIG. 3, less than. 0.010" to 0.020" or less than half a millimeter so as to eliminate plasma process between the tiles. The distance of the target tile assembly comprising target 12 to the dark space anode or ground shield 19, in FIGS. 1a and 1b can be somewhat larger so as to provide non contact assembly or provide for thermal expansion tolerance during process chamber conditioning or operation.

Figure 3:
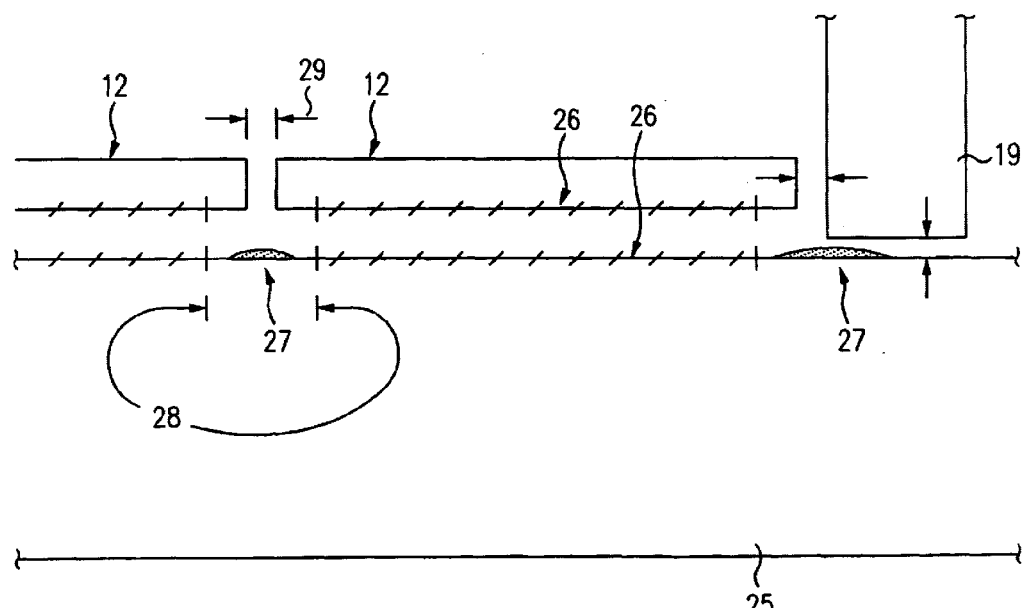
FIG. 3 is a detail view of a composite target according to an embodiment of the present invention.

The low thermal expansion and fragile condition of ideal optical dielectric tile material can be a cause of great difficulty in bonding and processing a wide area array of such tiles. The bonding process according to the present invention that overcomes these difficulties is illustrated in FIG. 3. Sputter coating a side of such a tile in region 26 prior to bonding with backing plate 25 can be accomplished with a layer of a material such as chrome or nickel as a diffusion layer. Such a metallurgical layer acts as a wetting layer to be tinned with a suitable solder material such as indium or an indium alloy. The backing plate 25 should be made of titanium or molybdenum or other low expansion metal so as to provide a good match with the thermal expansion of the tile material. A very important aspect of the formation of a tiled target is the finishing and coating of the backing plate prior to the solder bonding of the array of tiles. The portion 27 of the backing plate to be exposed to vacuum, either between the tiles or about the periphery or dark space region of the tile assembly should be bead blasted and plasma spray coated with a material such as alumina or silica to prevent contamination of the process by the target backing plate material. The portion 26 of the backing plate beneath the tile should be sputter coated with a material such as nickel or chrome to enable solder bonding. Pure indium solder, although it has a higher melting point than alloys such as indium-tin, is much more ductile. This allows the solder to yield during cooling of the solder bonded assembly relieving stress on the bonded tiles.

It is useful to provide an outer frame fixture which is located precisely for the location of the outer tiles. It is also useful to provide shim location, tile to tile, while the assembly is at temperature. The actual solder application and lay up procedure can be devised by those versed in solder assembly. It is essential for reasons of heat transfer that the solder forms a full fill of the volume between the tile and the backing plate. It is also essential that the solder not be exposed to the plasma. There should not be any visible solder in the region between the tiles or on the backing plate. To enable this condition it is useful to sputter coat the wetting layer area with an offset 28 of several millimeters on both the tile and the backing plate. It is also useful to pre-solder or tin both the tiles and the backing plate prior to final assembly. The solder material will not wet region 28 upon assembly. A mask for the sputter deposition of the diffusion barrier/wetting layer film is useful. Finally, cleaning of the bonded target tile assembly should utilize anhydrous cleaning rather than aqueous based cleaning methods.

Figure 4A:
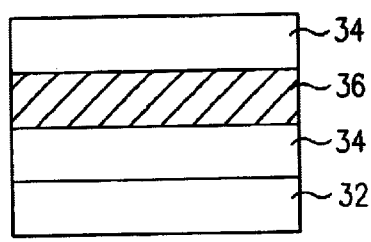
FIGS. 4a and 4b are cross section views illustrating a process of fabricating a surface ridge planar optical device, in which processes according to embodiments of the present invention, are used.
Figure 4B:
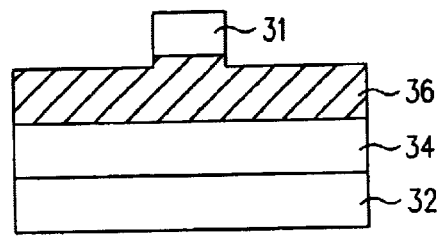

The RF sputtering methods for material deposition, described here, are combined with processes commonly used in semiconductor fabrication, such as photolithographic patterning and etching, to produce planar optical devices. A process to produce a surface ridge device is illustrated schematically in the device cross sections of FIGS. 4a and 4b. RF sputtering is used to deposit a layer of cladding material 34 on a substrate 32. A layer of core material 36, having a higher index of refraction than the cladding layer is then deposited by RF sputtering on the cladding layer 34, followed by another layer 34 of the cladding material, as shown in FIG. 4a. A ridge structure 31 is then formed in the upper cladding layer and a portion of the core material, as required by the design of the waveguide, by means of lithography and etching, FIG. 4b. The ridge 31, serves to guide the light in the core material. In the case that the core material is doped with a photoluminescent active material and the conditions for amplification are met, such a structure may be used as a planar waveguide amplifier device.

Figure 5A:
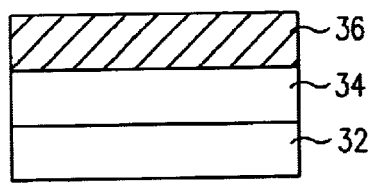
FIGS. 5a–5e are cross section views illustrating a process of fabricating a buried ridge planar optical device, in which processes according to embodiments of the present invention, are used.
Figure 5B:
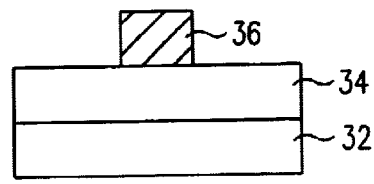
Figure 5C:
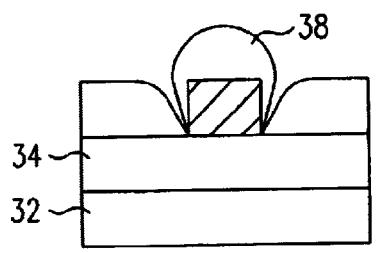

FIGS. 5a–5e illustrate the steps of forming a buried ridge planar wave-guide. FIG. 5a shows the same sequence of films as FIG. 4a without the upper cladding layer. FIG. 5b shows a ridge 37 that has been formed by lithography and etching from the core layer 36. The ridge is shown as unity aspect ratio but might have another aspect in cross section. FIG. 5c illustrates the conformity or ridge coverage shape 38 of an overlayer of the cladding material formed by means of standard RF sputtering. The line of sight arrival of the sputtered cladding material results in poor step coverage of those portions of the ridge having low solid angle exposure to the sputter cathode source. The film grows in a lateral direction from the upper corners of the ridge resulting in a 'bread loaf' shape. The overhang of the lateral growth causes the rate of deposition to decrease at the lower corner of the ridge. A 'bird's beak' shaped defect in the coverage is formed in the covering film. In micro-electronic applications, such a 'bird's beak', or leader, defect is the cause of electrical breakdown of an insulating dielectric layer. In the present optical application, a buried ridge wave-guide having an upper cladding as shown in FIG. 5c would demonstrate poor single mode confinement and substantial polarization dependence for the guided light due to the 'bird's beak defect. Substantial insertion loss would result from the roughness introduced by the defect in the longitudinal direction of the wave-guide.

Figure 5D:
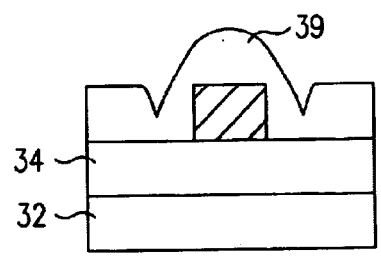

FIG. 5d illustrates the effect of dual frequency RF deposition on the formation of the coverage of the ridge. Using dual RF frequencies, a small amount of ion bombardment of the cladding layer 39 can be achieved during deposition, providing a small etch rate to reduce the lateral growth of the deposition on the top corners of the ridge. The small etch rate during deposition reduces the shadowing at the lower corner of the ridge and increases the step coverage. The low amount of ion bombardment also acts to densify the film by forward scattering of the adsorbed, sputtered material and provides for increased mobility of the sputtered material on the surface of the film. Both effects act to reduce the leader defect shown in FIG. 5c. FIG. 5d shows the improved step coverage 39 that can result from the application of dual frequency power for the sputter deposition of the upper cladding. Due to the fact that the lower frequency, of the dual frequency process, is applied to the cathode, the deposition rate will increase with the addition of the second frequency power. Thus, the positive effect of the second frequency can not be isolated from the deposition rate. However, the structure, shown in FIG. 5d, is not an ideal structure for the formation of a light wave guiding device because the step coverage defect has not been eliminated.

Figure 5E:
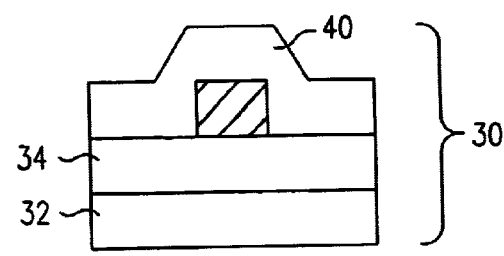

FIG. 5e shows the effect of the addition of substrate bias during the sputter deposition of the upper cladding layer. The substrate bias power is independent of the source power. The addition of further bias power to the substrate will increase the etch rate. In practice it may be equal to the source power. The rate of deposition of the film will be significantly greater on the horizontal features of the substrate then the rate of etching. However, due to the efficiency of ion etching of a feature of the film inclined near 45 degrees from the horizontal surface, the net accumulation at that angle may be very low. By adjusting the ratio of the bias to the sputter power, an angle of constant repose can be impressed upon the accumulation shape of the deposited cladding layer.

Figure 7:
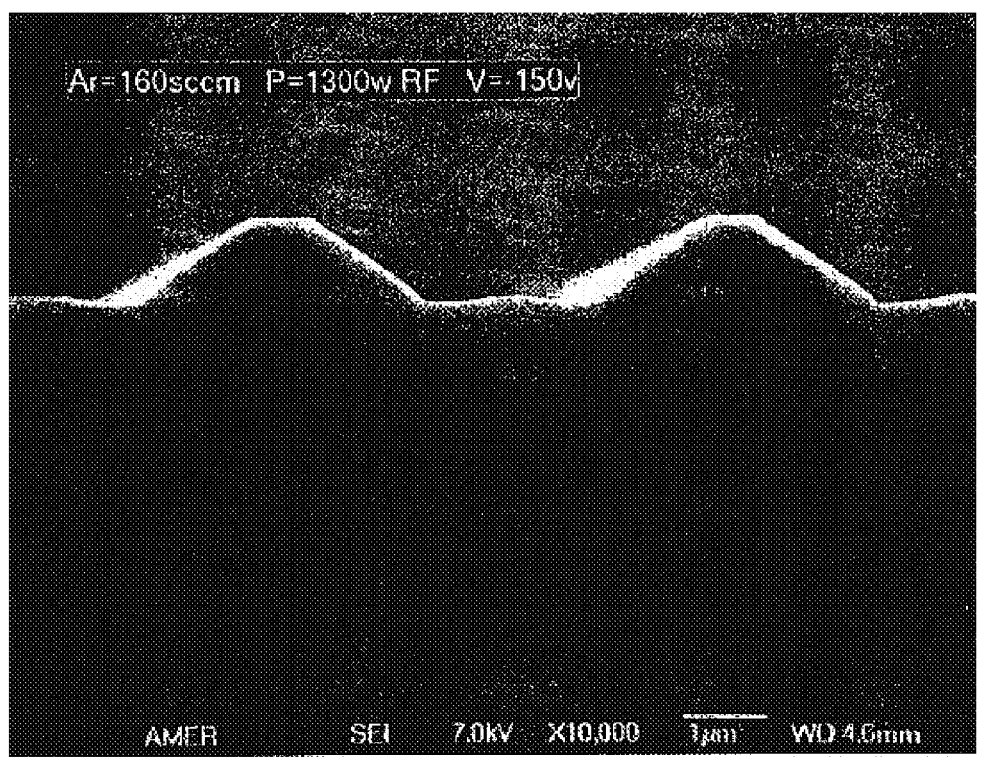
FIG. 7 is a scanning electron micrograph (SEM) of a layer deposited over a substrate patterned with trenches by a RF sputtering process including substrate bias, according to an embodiment of the present invention.

FIG. 5e shows schematically the step coverage that can be obtained in the cladding layer 40 by bias sputtering. FIG. 7 demonstrates that the smooth, straight sidewalls and characteristic 45 degree angles depicted schematically in FIG. 5e are achieved in practice. In particular, the leader defect and the shadowing effect of unbiased deposition can be completely eliminated. The step coverage can be increased by increasing the thickness of layer 40. While the discussion above has emphasized the beneficial geometrical effects of bias sputtering deposition of cladding layer 40, it is also useful to use bias sputtering to deposit all the layers of planar optical devices because of the increased transparency of bias sputtered materials. Also, since bias sputtering affects refractive index, it is desirable to use bias sputtering for both lower and upper cladding layers in order for the cladding layers to have the same refractive index.

A wave guide device 30, as shown in FIG. 5e, with very low polarization dependence and high quality mode containment can be obtained in a material such as pure silica. If such a device is realized in pure silica without the use of dopants, substantial improvement in thermal stability over present devices can be achieved. Device 30 may be used as a wave-guide or splitter. When the core is rare earth doped, it may be utilized to form an active device such as an optical amplifier. When formed by thin film methods, arrays of such devices may be created. Exemplary dimensions of the cross section of ridge 31 or 37 or core 46, discussed below, are from about 2×2 µm to about 9×9 µm. Exemplary dimensions for cladding layer 34 is between about 10 and 25 µm thick.

Figure 6A:
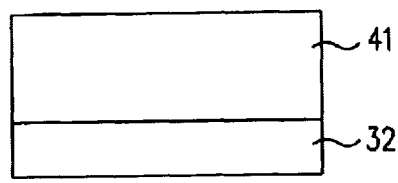
FIGS. 6a–6f are cross section views illustrating the process of fabricating a buried trench planar optical device, in which processes according to embodiments of the present invention, are used.
Figure 6B:
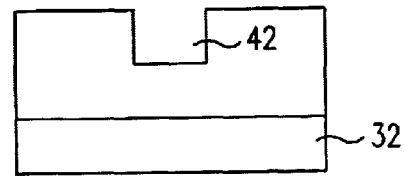
Figure 6C:
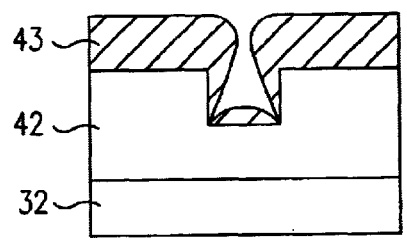
Figure 6D:
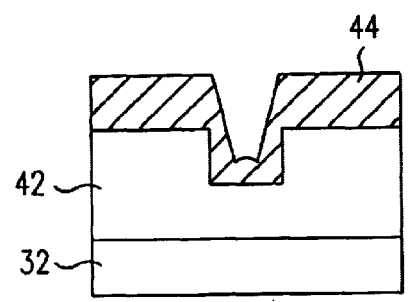

The process of forming a trench device 50 is shown schematically in FIGS. 6a–6f. First, a thick layer 41 of cladding material is deposited by RF sputtering on substrate 32, FIG. 6a. Next a trench 42 is formed by photolithographic patterning and etching in cladding layer 41, FIG. 6b. Core material 43 may be RF sputtered into the trench, FIG. 6c. As in the case of covering a ridge, the lateral growth of the surface film shadows the line of sight coverage of the trench. The maximum thickness of the bottom fill of an aspect one trench with a film of unity thickness may be less than 10 to 20%. In practice, the core layer can close off, leaving a void in the trench. The best prior art, teaches that the film 43 should be etched back. An etch back process removes the surface layer, opens the void if one has formed and leaves the partial fill in the trench, (see H. Ohkubo, et. al. "Polarization-Insensitive Arrayed-Waveguide Grating Using Pure $SiO_2$ Cladding, Proc. OECC 2000, Technical Digest, July 2000, Makuhari Messe, Japan.). A second deposition can fill the partially filled trench. In contrast, FIG. 6d shows the cladding layer applied by means of a dual frequency process. Using dual frequency, layer 44 remains open due to the etching influence of the second lower frequency. The bottom fill can increase to as much as 60 to 80%. While dual RF deposition is more successful at filling the trench than single frequency deposition, the processes not ideal for fabrication of buried trench waveguides.

Figure 6E:
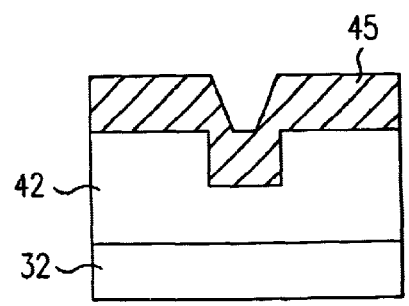
Figure 6F:
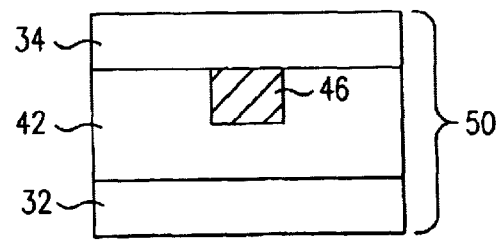

According to the present invention, a trench can be filled in a single process step using bias sputtering. FIG. 6e schematically shows core material deposited by means of RF bias sputtering of layer 45. FIG. 7 demonstrates complete trench fill has been achieved in practice with bias sputtering. The structure of FIG. 6e can be etched back by means of a bias process with the net rate of bias etching greater than the rate of deposition on the horizontal surface. It can also be mechanically polished or etched back. Deposition of a cladding layer by means of RF sputtering results in device 50 shown in FIG. 6f. Device 50 can be used as a polarization independent wave guide. In the prior art, Ohkubo, et. al., the core material was doped with germania to raise the index of refraction. In the present invention, the control of the index of deposited pure silica can be used to provide the higher index material of the core as a uniform layer. The wide area magnetron RF source will also provide a uniform plasma condition for the application of the uniform bias sputtering.

In the case of wave length division, Ohkubo, et. al. utilize a three step process of deposition, etch back and deposition to fill a trench between two ridge waveguide structures. In the design of planar waveguide structures there are many instances in which two core waveguide structures, formed either by etching a ridge or filling a trench, are brought together either to merge, thus forming a so called '3 dB' junction, or into close proximity so as to form a coupler. In these cases, narrow, deep structures are formed. In all these cases it is necessary to fill these structures of adjacency between nearby wave-guides. According to the present invention, the trench fill, the ridge coverage and the adjacent structure fill can be accomplished uniformly in the subject wide area RF bias sputtering process. In all cases, it is also necessary to adjust the index of refraction difference to a precise value. Such a value of Δn may be chosen from 0.1 to 0.8 percent for the purpose of weak mode confinement at a wavelength or for control of the numerical aperture of a waveguide device. The index difference may need to be uniform to ±5% of the difference for each film. The overall nonuniformity of each film, 1 percent of 5 percent is $5\times10^{-4}$. Evaluated at a nominal index of 1.50, such a nonuniformity corresponds to a variance of 0.00075 for each film. The nonuniformity of index reported here and achieved by means of wide area RF sputtering is, on first result, very close to the estimated value required for each film.

The features and benefits of the present methods of wide area target RF sputtering to provide materials for planar optical devices are further illustrated in the following examples which are offered by way of illustration, but not of limitation.

EXAMPLE 1

Deposition of $SiO_2$

An AKT 1600 series PVD production reactor (Applied Komatsu Technology, Santa Clara, Calif.) modified for RF application with custom ceramic tile targets was used for RF sputter deposition of $SiO_2$. A wide area target of dimension 550×650 mm was fabricated from four quartz tiles, each 4 mm thick, Corning code 9780 glass (Corning Inc. Elmira, N.Y.). The tiles were finished to a smooth surface, chemically cleaned, rinsed with hot deionized water, dried, and sputter coated with several microns of chrome. The chrome coated sides were bonded to a thin plate of titanium as described above. The titanium backing plate was prepared for bonding by bead blasting, chemical cleaning, and plasma coating with silicon. The tiles and the backing plate were heated to approximately 180° C. and regions were coated with a layer of liquid indium. The tiles were precisely placed on the backing plate such that they were separated by no more than 0.02 inches from each other and from the edges of the region exposed to the plasma.

A 150 mm p-type silicon wafer substrate was placed in the center of a 400×500 mm glass carrier sheet. 800 watts of power was applied to the target at 13.56 MHz. A race-track shaped magnet of approximate dimension 150 mm×600 mm was swept over the face of the target at a rate of 4 seconds per one-way scan (8 seconds per complete cycle.) Substrate temperature was uniformly held at 40° C. and the sputter gas was 99.99999% pure argon at a flow rate of 60 sccm. The target to substrate distance was 6.5 cm. Deposition efficiency was approximately 0.8 Å/kW-sec. Film thickness and index of refraction were measured at five equally spaced points over the full face of the wafer using a FilmTek 4000 interferometer. Refractive index at 1550 nm was 1.437998±0.001297 (0.09%); film thickness was 9227.66 nm with a nonuniformity of 6.8%. Results are included as Sample A in Table 1 below.

EXAMPLE 2

Deposition of $SiO_2$ with Index Modification $SiO_2$ films were deposited by processes analogous to that described in Example 1, varying deposition temperature, applied power, and process gas. Results are tabulated in Table 1 below.

TABLE 1

$SiO_2$ Thcikness and Refractive Index as Function of Deposition Conditions

| | Power (watts) | Temperature (° C.) | Sputtering gas/ Flow rate (sccm) | Refractive index* at 1550 nm | Thickness (nm)# |
|---|---|---|---|---|---|
| A | 800 | 40 | Ar/60 | 1.437998 (0.001297) | 9227.66 (6.8%) |
| B | 800 | 150 | Ar/60 | 1.440923 (0.001979) | 3133.25 |
| C | 800 | 400 | Ar/60 | 1.450126 (0.000726) | 9295.86 (4.8%) |
| D | 1200 | 150 | Ar/60 | 1.448610 (0.000976) | $9.2 \times 10^3$ |
| E | 800 | 150 | 2% $H_2$ in Ar/60 | 1.462198 (0.001809) | 1287.15 |
| F | 800 | 150 | $N_2$/20, Ar/40 | 1.580249 (0.008346) | 608.87 |
| G | 1400 | 150 | $N_2$/20, Ar/40 | 1.548439 (0.006499) | 2354.80 |
| H | 800 | 400 | Ar/60 | 1.450036 (0.000702) | 9295.84 (4.8%) |

*Standard deviation (1 σ) in parentheses
Thickness nonuniformity

EXAMPLE 3

Deposition of SiO and Erbium Doped SiO

Target tiles of SiO were prepared from a powder of SiO by low temperature isostatic pressure. The tiles were cut and bonded to a backing plate as described above. Mixed oxide tiles used to deposit erbium doped SiO were prepared by mixing powdered $Er_2O_3$ and SiO in a ratio of 2 molar cation percent erbia. SiO and Er doped SiO films were deposited as in Examples 1 and 2 above. Refractive index and thickness are tabulated for SiO in Table 2 and for Er doped SiO (SiO:Er) with an Er concentration of approximately $2 \times 10^{20}$ Er atoms/$cm^3$, in Table 3.

TABLE 2

SiO Thickness and Refractive Index as Function of Deposition Conditions

| | Power (watts) | Temperature (° C.) | Sputtering gas/ Flow rate (sccm) | Refractive index* at 1550 nm | Thickness (nm) |
|---|---|---|---|---|---|
| J | 1000 | 150 | Ar/60 | 2.084500 | 691.78 |
| K | 1000 | 150 | $N_2$/10, Ar/50 | 1.736693 (0.010250) | 1000.96 |
| L | 1000 | 150 | $N_2$/25, Ar/50 | 1.740680 | 770.08 |

*Standard deviation (1 σ) in parentheses

TABLE 3

SiO:Er Thickness and Refractive Index as Function of Deposition Conditions

| | Power (watts) | Temperature (° C.) | Sputtering gas/ Floow rate (sccm) | Refractive index* at 1550 nm | Thickness (nm) |
|---|---|---|---|---|---|
| M | 1000 | 150 | Ar/60 | 2.132780 | 791.35 |
| N | 1000 | 150 | $N_2$/10, Ar/50 | 1.740480 (0.017838) | 1501.04 |
| O | 1000 | 150 | $N_2$/25, Ar/50 | 1.750910 | 1400.11 |
| P | 1000 | 150 | $N_2$/50, Ar/25 | 1.792790 | 786.78 |
| Q | 800 | 400 | $O_2$/3, Ar/57 | 1.45825 (0.005425) | 1159.50 |

*Standard deviation (1 σ) in parentheses

EXAMPLE 4

Single and Dual Frequency RF Sputter Deposition of Silica

An AKT 1600 series PVD production reactor and wide area target as described in Example 1 was used. High frequency (13.56 MHz) and low frequency (about 350 kHz) process powers are listed along with surface roughness and refractive index (RI) of the deposited films in Table 4 below. Depositions were all conducted at Ar flow rates of 40 standard cubic centimeters per minute (sccm) and at or near room temperature, except as noted below. Refractive index at 1.5 μm was measured using a Film Tek 4000 normal incidence interferometer (SCI, Encinitas, Calif.). Average surface roughness, $R_a$, was determined from Atomic Force Microscopy (AFM) measurements using a NanoScope III 5000 instrument (Digital Instruments, Veeco Metrology Group, Santa Barbara, Calif.)

TABLE 4

Average Surface Roughness and Refractive Index of RF Sputtered Silica

| EXAMPLE | HF Power (kW) | LF Power (kW) | $R_a$ (nm) | RI | Total Power | LF/HF Power Ratio |
|---|---|---|---|---|---|---|
| A | 2.3 | — | 2.988 | 1.4492 | 2.300 | 0 |
| B | 2.3 | — | 2.804 | 1.4494 | 2.300 | 0 |
| C | 2.3 | — | 3.412 | 1.4473 | 2.300 | 0 |
| D | 2.0 | 0.350 | 1.818 | 1.4538 | 2.350 | 0.175 |
| E | 2.0 | 0.350 | 1.939 | 1.4533 | 2.350 | 0.175 |
| F | 2.0 | 0.350 | 2.007 | 1.4547 | 2.350 | 0.175 |
| G | 2.0 | 0.350 | 2.571 | 1.4520 | 2.350 | 0.175 |
| H | 1.7 | 0.600 | 1.729 | 1.4560 | 2.300 | 0.353 |
| I | 1.7 | 1.000 | 1.445 | 1.4617 | 2.700 | 0.588 |
| J | 3.0 | 0.525 | 2.359 | 1.4542 | 3.525 | 0.175 |
| K* | 2.0 | 0.350 | 3.419 | 1.4523 | 2.350 | 0.175 |
| L# | 3.0 | 0.525 | 4.489 | 1.4449 | 3.525 | 0.175 |

*Deposition temperature 225° C.
Ar flow rate 120 sccm

Films deposited with a single frequency RF process (Examples A–C) had average surface roughness values in the range of 2.8 to 3.4 nm while the dual frequency process produced films with systematically lower average surface roughness of between 1.4 and 2.6 nm. Keeping other process conditions the same, increasing the ratio of low frequency to high frequency power is seen to result in decreasing surface roughness. Refractive index is observed to have the opposite proportional dependence on power ratio; increasing the low frequency power contribution results in films with higher refractive index. Beneficially, the higher refractive index material has the lower average surface roughness. Thus, in similar processes, core layer material can be obtained by using dual frequency deposition without use of dopants to modify the index of either layer, while using only the high frequency component produces a material of lower refractive index suitable for the cladding layer.

EXAMPLE 5

RF Sputter Deposition of Silica with Substrate Bias

An AKT 4300 series PVD production reactor (Applied Komatsu Technology, Santa Clara, Calif.) modified to accept custom ceramic tile targets and modified to induce a voltage on the substrate was used to deposit silica on planar and patterned 100 mm silicon wafers. A wide area target of dimension 750×870 mm was fabricated as described in Example 1. The wafers were placed in the center of a Corning code 1739 glass carrier sheet opposite the target. The reactor was operated in the diode sputtering mode, without magnetic enhancement, at a high frequency RF power of 2500 W and an induced voltage of −400V. A bas voltage of −125 V at 2 MHz and 250 W was induced on the substrate. An argon gas flow rate of 160 sccm was used.

Average surface roughness of a 0.75 μm thick film deposited on a planar wafer, determined as in Example 4, was 0.14 nm. The refractive index determined as the average of measurements at 12 points on the surface was 1.4622 with a uniformity, defined as the difference of the minimum and maximum values divided by twice the average, of $3.4 \times 10^{-5}$ percent. To the best knowledge of the inventors, the exceptional uniformity reported here exceeds that of any vacuum deposited film reported previously.

FIG. 7 shows an SEM image of a silica film deposited over a patterned substrate. The trenches in the patterned substrate are seen to be completely and uniformly filled and the ridges are uniformly covered. The top surface of the layer overlying the ridges is flat and the sloping sides of the layer overlying the ridges are nominally at 45 degree angles. All of the foregoing geometric features are characteristic of bias sputtering deposition. As reported above, for trench features with unit aspect ratio, the maximum thickness at the bottom of the trench of films deposited by conventional RF sputtering is less than about 10–20%.

Although the present invention has been described in terms of specific materials and conditions, the description is only an example of the invention's application. Various adaptations and modifications of the processes disclosed are contemplated within the scope of the invention as defined by the following claims.

We claim:

1. A method of making a composite sputtering target comprising a plurality of tiles, the target used for physical vapor deposition of material, the method comprising:

sputter coating a side of each of the plurality of tiles with a wetting layer material to within an offset of the edge of each tile;

providing a backing plate composed of a metal with thermal expansion coefficient similar to the thermal expansion coefficient of the plurality of tiles;

plasma spray coating the backing plate with a ceramic material so as to cover the regions of the backing plate exposed during physical vapor deposition;

sputter coating regions of the backing plate corresponding in placement to the wetted regions of the tiles with a wetting layer;

wetting the sputtered regions of the plurality of tiles and of the backing plate with solder material; and assembling the plurality of tiles on the backing plate so as to form a solder bonded non contacting array of uniformly spaced tiles.

2. The method of claim 1 wherein the plurality of tiles comprise an alloy material.

3. The method of claim 1 wherein the wetting layer material comprises chrome or nickel or mixtures thereof.

4. The method of claim 1 wherein the ceramic material comprises alumina or silica.

5. The method of claim 1 wherein the solder material is indium.

* * * * *